United States Patent
Yang et al.

(10) Patent No.: US 9,716,143 B2
(45) Date of Patent: Jul. 25, 2017

(54) SILICIDE REGIONS IN VERTICAL GATE ALL AROUND (VGAA) DEVICES AND METHODS OF FORMING SAME

(71) Applicant: Taiwan Semiconductor Manufacturing Company, Ltd., Hsin-Chu (TW)

(72) Inventors: Kai-Chieh Yang, Kaohsiung (TW); Wai-Yi Lien, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/194,238

(22) Filed: Jun. 27, 2016

(65) Prior Publication Data

US 2016/0308002 A1    Oct. 20, 2016

Related U.S. Application Data

(62) Division of application No. 14/577,699, filed on Dec. 19, 2014, now Pat. No. 9,412,817.

(51) Int. Cl.
| | |
|---|---|
| *H01L 29/66* | (2006.01) |
| *H01L 29/06* | (2006.01) |
| *H01L 29/78* | (2006.01) |
| *H01L 29/775* | (2006.01) |
| *H01L 29/417* | (2006.01) |
| *H01L 29/423* | (2006.01) |
| *H01L 29/45* | (2006.01) |

(52) U.S. Cl.
CPC ...... *H01L 29/0676* (2013.01); *H01L 29/0649* (2013.01); *H01L 29/41741* (2013.01); *H01L 29/42392* (2013.01); *H01L 29/45* (2013.01); *H01L 29/66439* (2013.01); *H01L 29/66666* (2013.01); *H01L 29/775* (2013.01); *H01L 29/7827* (2013.01); *H01L 29/456* (2013.01)

(58) Field of Classification Search
CPC ............... H01L 29/0676; H01L 29/0649
USPC ........................................... 257/329
See application file for complete search history.

(56) References Cited

U.S. PATENT DOCUMENTS

| | | | |
|---|---|---|---|
| 7,667,271 B2 | 2/2010 | Yu et al. | |
| 7,910,453 B2 | 3/2011 | Xu et al. | |
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |

(Continued)

FOREIGN PATENT DOCUMENTS

| | | |
|---|---|---|
| JP | 2006332662 A | 12/2006 |
| JP | 2011238909 A | 11/2011 |
| JP | 20120139067 A | 12/2012 |

*Primary Examiner* — Anthony Ho
(74) *Attorney, Agent, or Firm* — Slater Matsil, LLP

(57) ABSTRACT

An embodiment semiconductor device includes a nanowire extending upwards from a semiconductor substrate, a source/drain region in the nanowire, and a channel region in the nanowire over the source/drain region. The source/drain region further extends into the semiconductor substrate past edges of the nanowire. The semiconductor device further includes a gate structure encircling the channel region and a silicide in an upper portion of the source/drain region. A sidewall of the silicide is aligned with a sidewall of the gate structure.

20 Claims, 17 Drawing Sheets

(56) References Cited

U.S. PATENT DOCUMENTS

| | | |
|---|---|---|
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 2006/0273389 A1 | 12/2006 | Cohen et al. |
| 2011/0253981 A1 | 10/2011 | Rooyackers et al. |
| 2011/0303973 A1 | 12/2011 | Masuoka et al. |
| 2012/0319201 A1 | 12/2012 | Sun et al. |
| 2014/0001574 A1 | 1/2014 | Chen et al. |
| 2014/0110755 A1 | 4/2014 | Colinge |
| 2014/0151812 A1 | 6/2014 | Liaw |

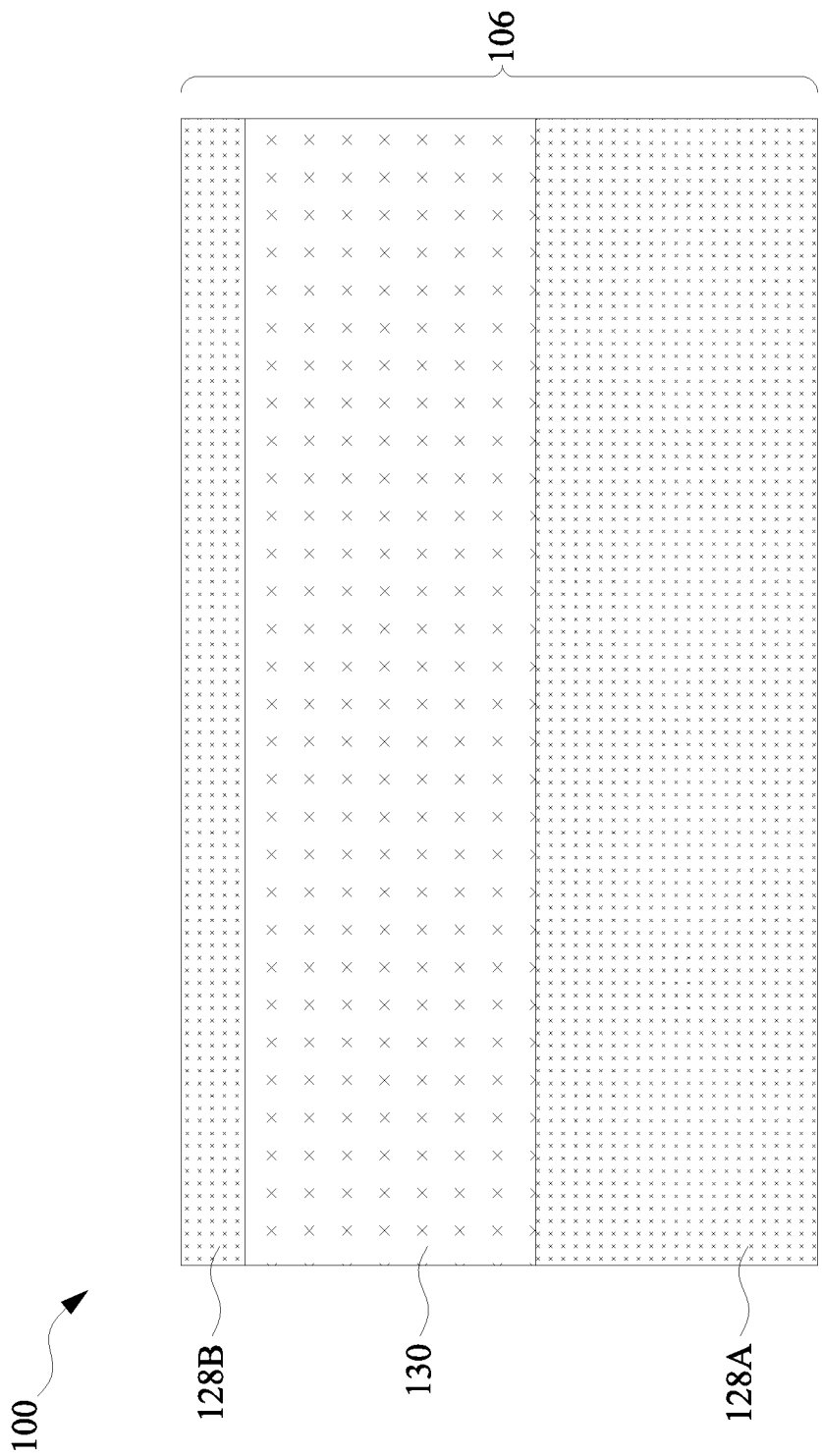

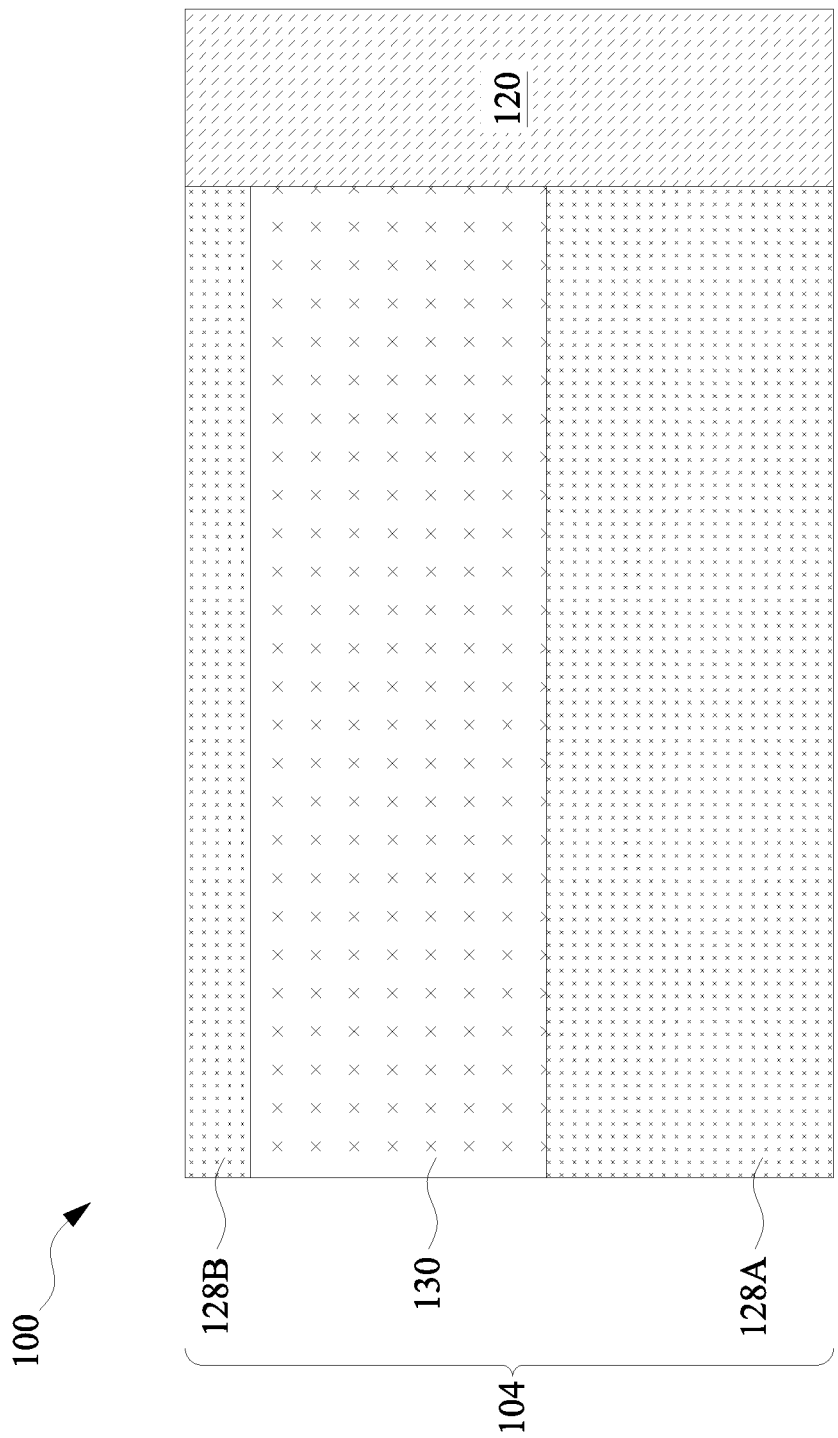

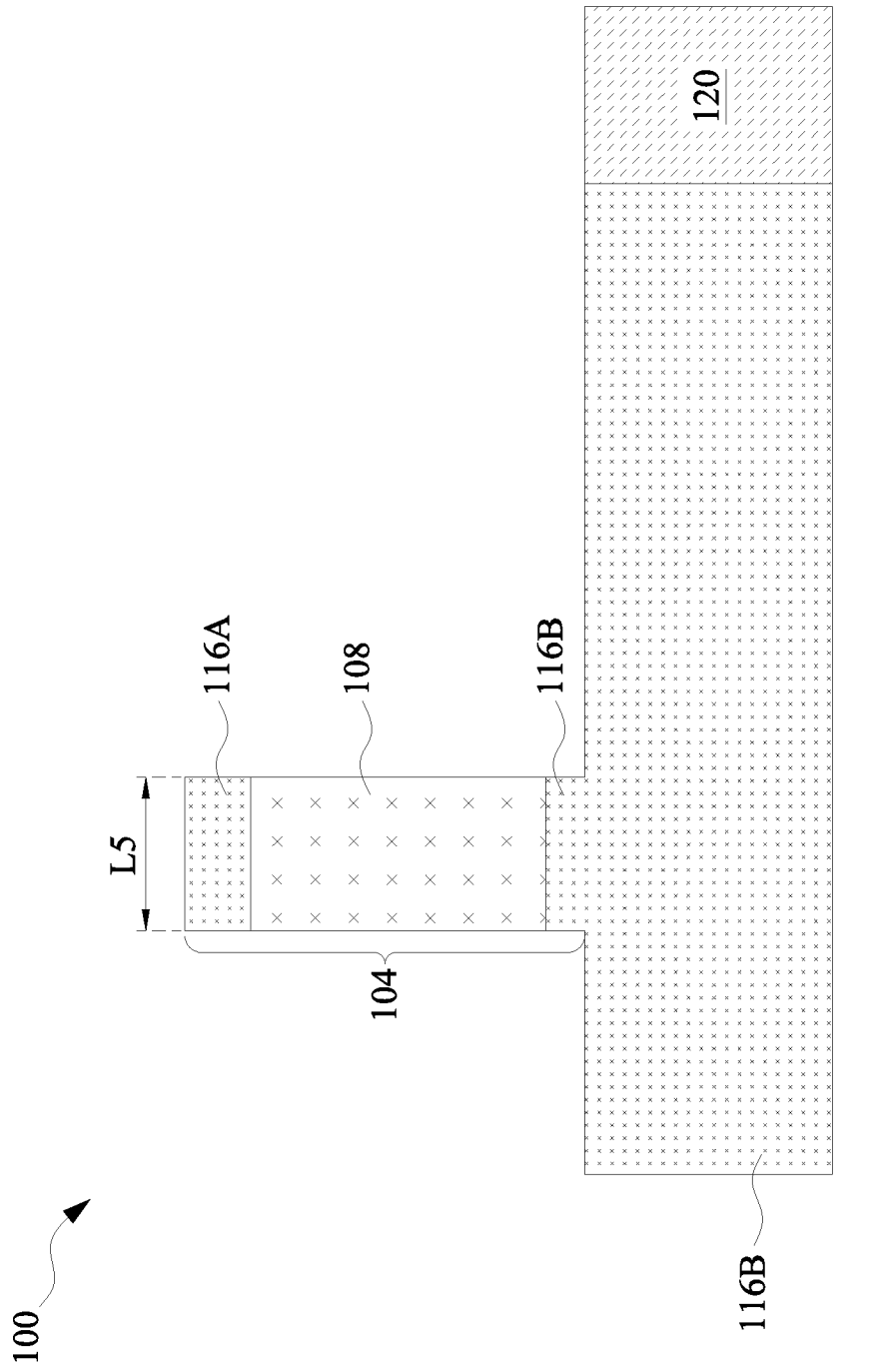

SILICIDE REGIONS IN VERTICAL GATE ALL AROUND (VGAA) DEVICES AND METHODS OF FORMING SAME

PRIORITY CLAIM

The present invention is a divisional of U.S. patent application Ser. No. 14/577,699, filed on Dec. 19, 2014, and entitled "Silicide Regions in Vertical Gate All Around (VGAA) Devices and Methods of Forming Same," which application is incorporated herein by reference.

BACKGROUND

As the semiconductor industry has progressed into nanometer technology nodes in pursuit of higher device density, higher performance, and lower costs, challenges from both fabrication and design issues have resulted in the development of three-dimensional designs, such as a vertical gate all around (VGAA) transistor. A typical VGAA transistor enables enhanced control of the charge carriers along the lengthwise direction through a complete encirclement of the channel region of a semiconductor nanowire by a gate dielectric and a gate electrode. The VGAA transistor has a reduced short channel effect, because the channel region may be surrounded by the gate electrode so that an effect of the source/drain region on an electric field of the channel region may be reduced.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 through 15 illustrate cross-sectional views of various intermediary stages of forming a semiconductor device having a VGAA transistor in accordance with some embodiments.

DETAILED DESCRIPTION

Figure 1A:
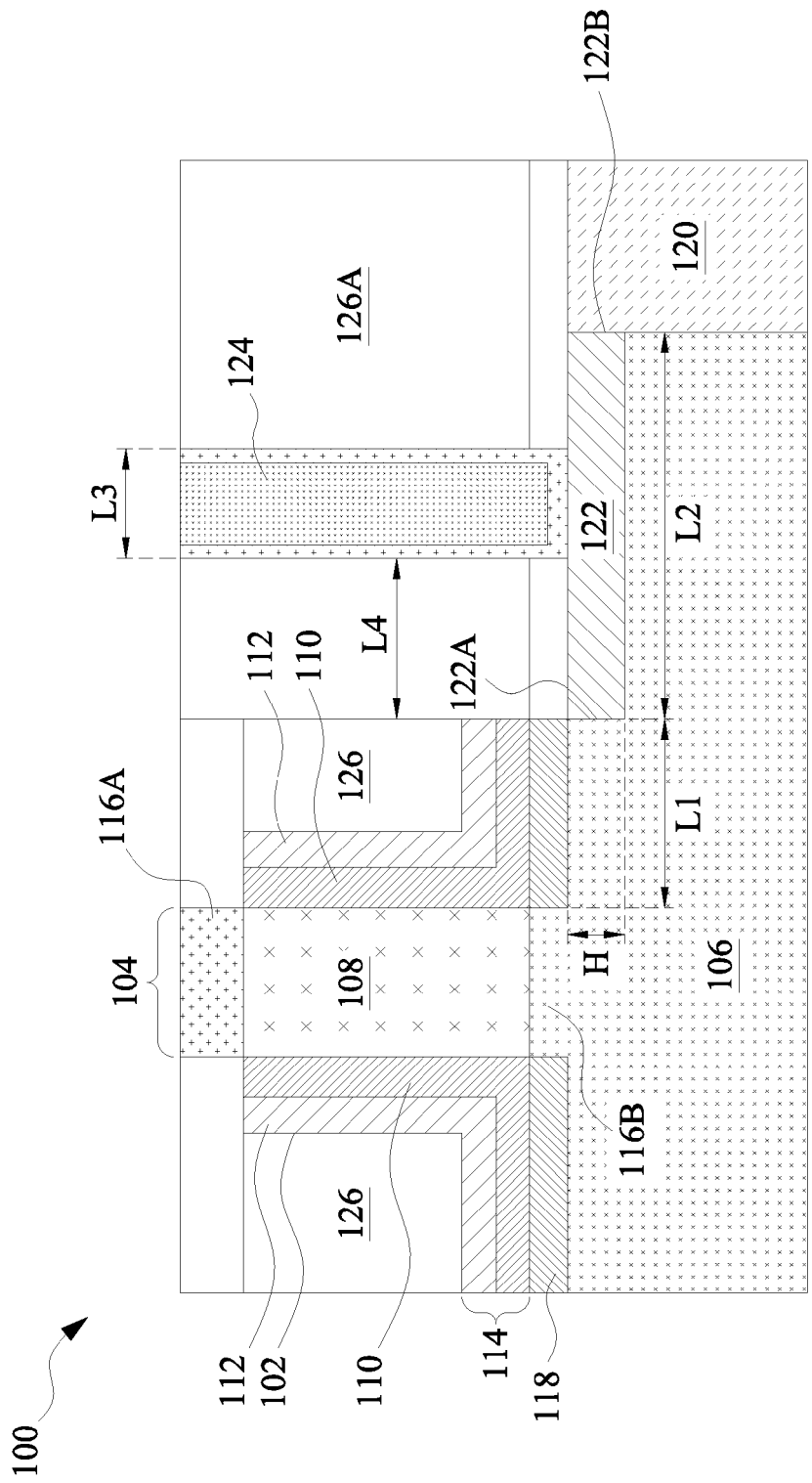
FIGS. 1A and 1B illustrate a semiconductor device having a vertical gate all around (VGAA) transistor in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments include a vertical gate all around (VGAA) transistor and methods of forming the same. The VGAA transistor includes a nanowire extending upwards from a semiconductor substrate. The nanowire includes a bottom source/drain region, a middle channel region over the bottom source/drain region, and a top source/drain region over the channel region. A gate structure is disposed around and encircles the channel region of the VGAA transistor. The bottom source/drain region may extend into an upper portion of the substrate and extend laterally past edges of the nanowire. A self-aligned silicide region may be formed in an upper portion of the bottom source/drain region after the gate structure but before a corresponding interlayer dielectric (ILD) or contact to the bottom source/drain region are formed. Thus, the silicide region can be formed to have a greater surface area than a subsequently formed contact, advantageously reducing contact resistance. Furthermore, the resulting silicide region may be spaced closer to the nanowire (e.g., the channel region), which also advantageously reduces parasitic resistance.

Figure 1B:
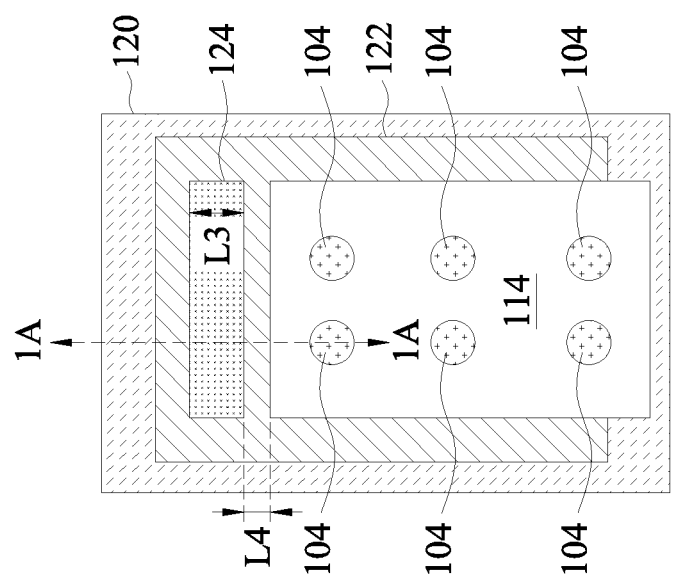

FIGS. 1A and 1B illustrate a semiconductor device 100 having VGAA transistors 102 in accordance with some embodiments. FIG. 1A illustrates a cross-sectional view of semiconductor device 100 while FIG. 1B illustrates a corresponding top-down view. The cross-sectional view of semiconductor device 100 in FIG. 1A may be taken across the line 1A-1A of FIG. 1B.

Referring first to FIG. 1A, a VGAA transistor 102, which may be a p-type or n-type device, is illustrated. VGAA transistor 102 includes a nanowire 104 extending upwards from an underlying substrate 106. Nanowire 104 includes a vertical channel region 108 of VGAA transistor 102. A gate structure 114 comprising a gate dielectric 110 and a gate electrode 112 forms a full ring encircling the vertical channel region 108 as illustrated in the top-down view of FIG. 1B. As further illustrated by FIG. 1B, semiconductor device 100 may include multiple VGAA transistors 102, each of which may include a nanowire 104. Nanowires 104 may share a continuous gate structure 114 encircling vertical channel regions 108 in each nanowire 104. Channel regions 108 may be substantially undoped or lightly doped with n-type or p-type dopants depending on whether VGAA transistor 102 is n-type or p-type transistor. In some embodiments, the dopant concentration of channel region 108 may be less than about $1\times10^{18}$ cm$^{-3}$.

Furthermore, referring back to FIG. 1A, in VGAA transistor 102, one of the source/drain regions 116A is over vertical channel region 108, and the other one of the source/drain regions 116B is underlying vertical channel region 108. The underlying source/drain region 116B may further extend into an upper part of substrate 106, and source/drain region 116B may extend laterally beyond edges of nanowire 104. A spacer layer 118 may be used to prevent gate structure 116 from contacting underlying source/drain region 116B (e.g., portions of source/drain region 116B extending outwards from nanowire 104). In some embodiments, spacer layer 118 may comprise a dielectric material, such as silicon nitride (SiN). Source/drain regions 116A/116B may be doped with a suitable n-type or p-type dopant at a higher concentration than channel region 108. For example, in some embodiments, the dopant concentration of source/drain regions 116A/116B may be about $1\times10^{20}$ cm$^{-3}$ to about $1\times10^{22}$ cm$^{-3}$ or even greater.

One or more shallow trench isolation (STI) regions 120 may be disposed in substrate 106, and each STI region 120 may be used to separate various semiconductor devices (e.g., VGAA transistors 102) in different regions. For example, STI region 120 may be used to isolate devices of a different type (n-type or p-type), of a same type, or the like.

A silicide 122 is formed at a top surface of a portion of source/drain region 116B. In some embodiments, silicide 122 may comprise a combination of a semiconductor material in combination with a metallic material, such as, titanium, nickel, cobalt, and the like. For example, silicide 122 may comprise titanium silicon (TiSi), nickel silicon (NiSi), cobalt silicon (CoSi), and the like. Silicide 122 may have a vertical dimension H of about 3 nanometers (nm) to about 30 nm, for example. As will be discussed in greater detail below, silicide 122 may be formed after gate structure 114, and the formation of silicide 122 may be self-aligned to extend from an edge of STI region 120 to an edge of gate structure 114. For example, a first sidewall of 122A of silicide 122 may by aligned with a sidewall of gate structure 114 while a second sidewall 122B of silicide 122 may be aligned with a sidewall of STI region 120. Because silicide 122 is formed using a self-aligned process, silicide 122 may also be referred to as a self-aligned silicide (salicide).

In various embodiments, silicide 122 may be closer to nanowire 104 than a subsequently formed source/drain contact (e.g., contact 124), and silicide 122 may only be spaced apart from nanowire 104 may a lateral dimension L1 of gate structure 114 on one side of nanowire 104. For example, in comparison to methods that form the silicide and contacts after forming the ILD, the silicide is aligned with source/drain contact 124, which is spaced farther apart from channel region 108 in nanowire 104. In some embodiments, lateral dimension L1 is may be about 5 nm to about 50 nm. Furthermore, as illustrated by FIG. 1B, silicide 122 may be disposed adjacent multiple sides of gate structure 114 depending on the location of various STI regions 120 adjacent gate structure 114.

Source/drain contact 124 may extend through an interlayer dielectric (ILD) 126 and electrically connect to silicide 122. Contact 124 may comprise a conductive material, such as, tungsten, aluminum, copper, gold, silver, alloys thereof, combinations thereof, and the like. In various embodiments, contact 124 and at least a portion of ILD 126 (e.g., portion 126A) may be formed after silicide 122. In such embodiments, a lateral dimension L2 of silicide 122 may be larger than a lateral dimension L3 of source/drain contact 124. For example, in some embodiments, lateral dimension L2 may be about 10 nm to about 100 nm whereas lateral dimension L3 may be about 6 nm to about 100 nm. In such embodiments, the contact surface area of silicide 122 may be increased, improving yield and lowering contact resistance. Furthermore, by forming silicide 122 before contact 124 and at least a portion of ILD 126, silicide 122 may extend to a sidewall of gate structure 114. Thus, silicide 122 may be spaced closer to nanowire 104 than contact 124 by a lateral distance L4, which may be defined as a lateral distance between gate structure 114 and contact 124. For example, lateral distance L4 may be about 4 nm or even greater. Because silicide 122 is closer to nanowire 104 (and consequently channel region 108), parasitic resistance in VGAA transistor 102 may also be advantageously reduced.

Throughout the description, the terms "horizontal" or "lateral" are defined as a direction parallel to a major surface (e.g., surfaces perpendicular to nanowire 104) of substrate 106 whereas "vertical" is defined as a direction perpendicular to the major surface of substrates 106. The terms "horizontal," "lateral," and "vertical" are relative and not meant to impose any sort of absolute orientation. Furthermore, in a top down view of contact 124, lateral dimension L3 may be taken either along an x-axis or a y-axis. Although FIG. 1B illustrates contact 124 as being substantially rectangular, contact 124 may be configured in any suitable shape, such as square, circular, ovular, or the like.

FIGS. 2 through 15 illustrate cross-sectional views of various intermediary steps of forming semiconductor device 100 in accordance with various embodiments. In FIGS. 2 through 4, a nanowire 104 is formed extending upwards from an underlying semiconductor substrate 106. Referring first to FIG. 2, a multilayer substrate 106 is illustrated comprising various substrate layers 128A, 130, and 128B. Bottom substrate layer 128A may be a high-dopant region (e.g., having a concentration of n-type or p-type dopants of about $1\times10^{20}$ cm$^{-3}$ to about $1\times10^{22}$ cm$^{-3}$ or even greater) of a base substrate layer (not illustrated). Alternatively, bottom substrate layer 128A may be formed over a base substrate layer using an epitaxy process, such as metal-organic (MO) chemical vapor deposition (CVD), molecular beam epitaxy (MBE), liquid phase epitaxy (LPE), vapor phase epitaxy (VPE), selective epitaxial growth (SEG), combinations thereof, and the like.

The base substrate layer may be a semiconductor substrate, such as a bulk semiconductor, a semiconductor-on-insulator (SOI) substrate, or the like, which may be doped (e.g., with a p-type or an n-type dopant) or undoped. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the base substrate layer may include silicon (Si); germanium (Ge); a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

As further illustrated by FIG. 2, additional substrate layers 130 and 128B may be formed over substrate layer 128A. In some embodiments, various epitaxies may be performed to form various substrate layers 128A, 130, and/or 128B. Any suitable epitaxy processes may be used, such as by MO CVD, MBE, LPE, VPE, SEG, combinations thereof, or the like. Substrate layer 130 may be a lightly-doped or undoped layer (e.g., having a dopant concentration less than about 1×1018 cm-3) whereas substrate layer 128B may be highly-doped (e.g., having a dopant concentration of about 1×1020 cm-3 to about 1×1022 cm-3 or even greater). Furthermore, substrate layer 130 may be doped with dopant of a different type than substrate layers 128A/128B. The implantation of dopants in substrate layers 128A, 130, and 128B may be achieved using any suitable method.

Next, in FIG. 3, an STI region 120 is formed in substrate 106. Although only one STI region 120 is illustrated extending into substrate 106, multiple STI regions 120 may be formed to separate various regions of substrate 106. In embodiments, STI region 120 may be formed by patterning an opening in substrate 106 and filling the opening with a dielectric material.

For example, a hard mask and/or photoresist (not illustrated) may be disposed over substrate 106. The hard mask may comprise one or more oxide (e.g., silicon oxide) and/or nitride (e.g., silicon nitride) layers to prevent damage to the underlying substrate 106 during patterning, and the hard mask may be formed using any suitable deposition process, such as, atomic layer deposition (ALD), CVD, high density plasma CVD (HDP-CVD), physical vapor deposition (PVD), and the like. The photoresist may comprise any suitable photosensitive material blanket deposited using a suitable process, such as, spin on coating, and the like.

To pattern substrate 106, the photoresist may first be patterned by exposing the photoresist (e.g., by exposure to light) using a photomask. Exposed or unexposed portions of the photoresist may then be removed depending on whether a positive or negative resist is used. The pattern of the photoresist may then be transferred to the hard mask (e.g., using a suitable etching process). Subsequently, one or more openings are patterned into substrate 106 using the hard mask as a patterning mask during an etching process, for example. The etching of substrate 106 may include acceptable etch processes, such as a reactive ion etch (RIE), neutral beam etch (NBE), the like, or a combination thereof. The etching may be anisotropic. Subsequently, the photoresist is removed in an ashing and/or wet strip processes, for example. The hard mask may also be removed.

The openings in substrate 106 may then be filled with a dielectric material, such as, silicon oxide, or the like. In some embodiments, the resulting STI region 120 may be formed using a HPD-CVD process, using silane (SiH4) and oxygen (O2) as reacting precursors. In other embodiments, STI region 120 may be formed using a sub-atmospheric CVD (SACVD) process or high aspect-ratio process (HARP), wherein process gases may comprise tetraethylorthosilicate (TEOS) and ozone (O3). In yet other embodiments, STI region 120 may be formed using a spin-on-dielectric (SOD) process, such as hydrogen silsesquioxane (HSQ) or methyl silsesquioxane (MSQ). An annealing (or other suitable process) may be performed to cure the material of STI region 120. In some embodiments, a liner (e.g., a semiconductor nitride/oxide/oxynitride, not illustrated) may be formed on sidewalls and a bottom surface of STI region 120, and the liner may prevent (or at least reduce) the diffusion of semiconductor material from substrate 106 into STI region 120 during the annealing. Other processes and materials may be used. A chemical mechanical polish (CMP) or etch back process may be used to remove excess STI material (and liner material) from a top surface of substrate 106.

In FIG. 4, substrate 106 and STI region 120 is further patterned to form nanowire 104. The patterning of nanowire 104 may be done using a combination of photolithography and etching as described above, for example. In some embodiments, nanowire 104 has a lateral dimension L5 of about 5 nm to about 50 nm, for example. Nanowire wire 104 includes a top highly-doped semiconductor portion 116A, a middle lightly-doped or undoped semiconductor portion 108, and a bottom highly-doped semiconductor portion 116B. Portions 116A, 108, and 116B correspond to semiconductor layers 128B, 130, and 128A, respectively. In the completed VGAA transistor (see e.g., FIG. 1A), portion 116A is a first source/drain region, portion 108 is a channel region, and portion 116B is a second source/drain region. Furthermore, portion 116B may extend into an upper portion of underlying substrate 106 and extend laterally past edges of nanowire 104.

Figure 5:
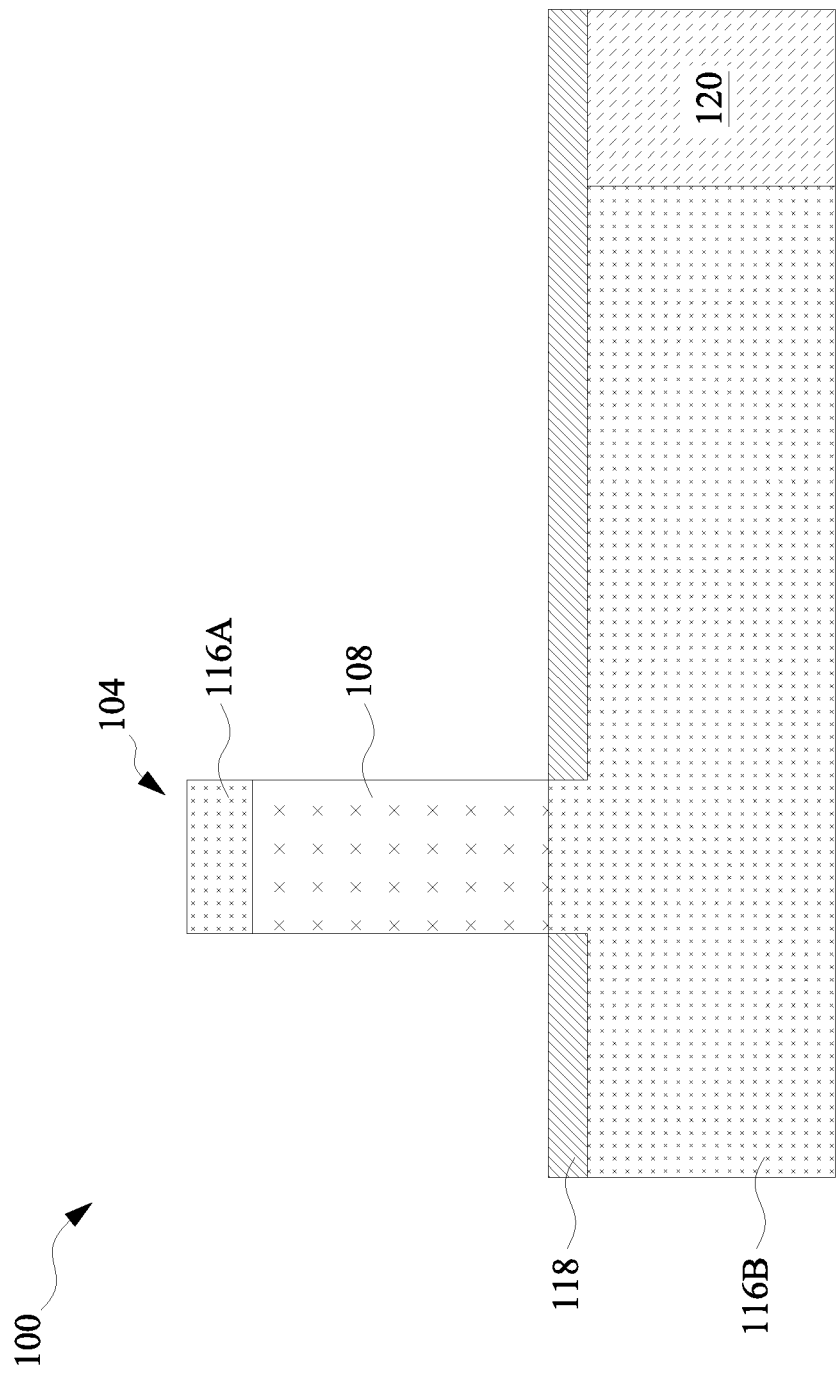

Referring next to FIG. 5, spacer layer 118 is formed over a lateral surface of source/drain region 116B extending past nanowire 104. Spacer layer 118 may also be formed over STI region 120. A top surface of spacer layer 118 may be substantially level with or higher than a top surface of source/drain region 116B in nanowire 104. In some embodiments, spacer layer 118 may comprise a dielectric material, such as silicon nitride, for example, formed using any suitable process, such as, CVD, PVD, ALD, and the like. In some embodiments, the deposition of spacer layer 118 may be a conformal process, and an etch back process may be performed to remove excess portions of spacer layer 118 from sidewalls of source/drain region 116A, sidewalls of channel region 108, and a top surface of nanowire 104. In the completed VGAA transistor (see e.g., FIG. 1A), spacer layer 118 may be used to prevent a gate structure from contacting underlying source/drain region 116B.

Figure 6:
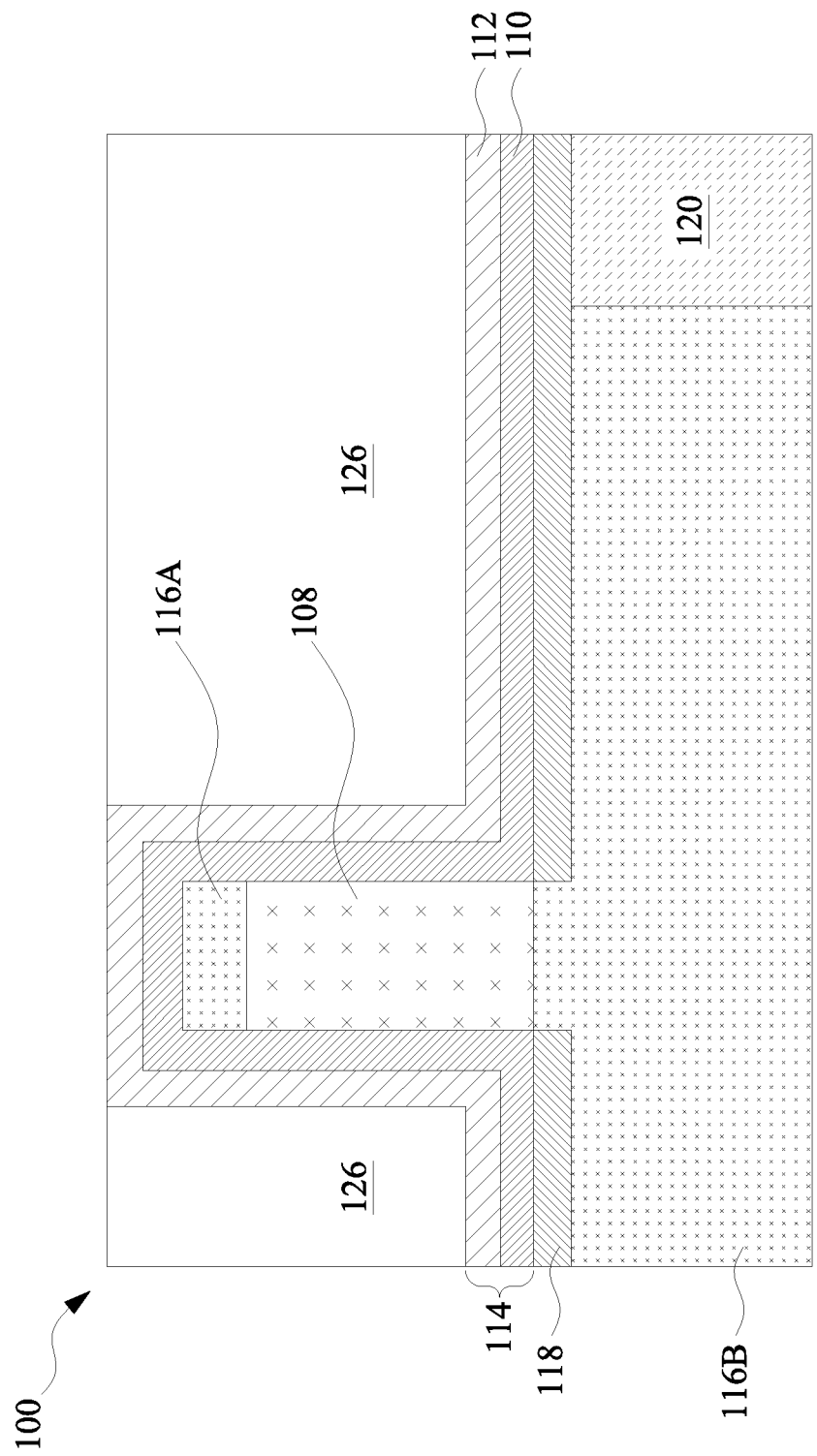

Next, referring to FIG. 6, gate stack 114 is formed over spacer layer 118 and on a top surface and sidewalls of exposed portions of nanowire 104. Gate stack 114 may include a conformal gate dielectric no and a conductive gate electrode 112 over gate dielectric 110. Gate structure 114 may encircle all sides of channel regions 108 (see e.g., FIG. 1B). Gate structure 114 may be spaced apart from and not contact source/drain region 116B due to the inclusion of spacer layer 118.

In some embodiments, gate dielectric no includes silicon oxide, silicon nitride, or multilayers thereof. Additionally or alternatively, gate dielectric no may include a high-k dielectric material. In such embodiments, gate dielectric no may have a k value greater than about 7.0, and may include a metal oxide or a silicate of hafnium (Hf), aluminum (Al), zirconium (Zr), lanthanum (La), magnesium (Mg), barium (Ba), titanium (Ti), lead (Pb), combinations thereof, and the like. The formation methods of gate dielectric 110 may include molecular beam deposition (MBD), ALD, PECVD, and the like. Conductive gate electrode 112 is formed over gate dielectric 110 using a suitable deposition process such as MBD, ALD, PECVD, and the like. Gate electrode 112 may include a metal-containing material such as titanium nitride (TiN), tantalum nitride (TaN), tantalum carbon (TaC), cobalt (Co), ruthenium (Ru), aluminum (Al), combinations thereof, multi-layers thereof, and the like. Because gate structure 114 is formed before any silicides (e.g., silicide 122, see FIG. 1A), the formation processes used for gate structure 114, which may also include annealing and/or curing processes, may not cause any damage to the subsequently formed silicide.

As further illustrated by FIG. 6, ILD 126 may be formed over gate structure 114. ILD 126 may comprise a low-k dielectric having a k-value less than about 3.9, such as about 2.8 or even less. In some embodiments ILD 126 comprises a flowable oxide formed using, for example, flowable chemical vapor deposition (FCVD). In some embodiments, ILD 126 may also contain a protection layer (not separately illustrated) beneath the flowable oxide, the materials of such protection layer include SiN, SiON, and the like. In some embodiments, ILD 126 may be used as a planarization layer to provide a level top surface for device 100 for subsequent processing. Thus, a CMP (or other suitable planarization process) may be performed to level the top surfaces of ILD 126 and gate structure 114.

Figure 7:
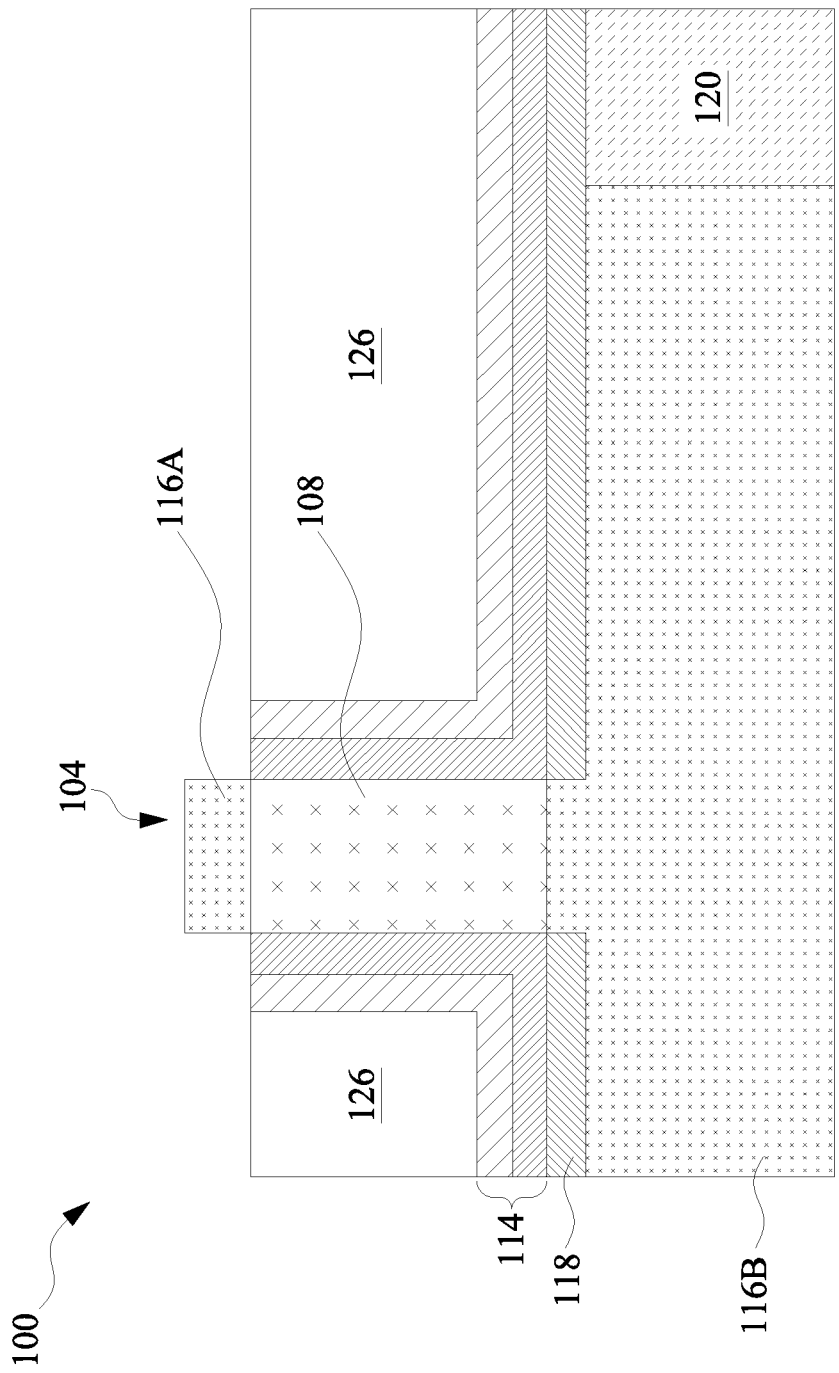

The subsequent processing may include an etch back process to pattern ILD 126 and gate structure 114 expose source/drain region 116A as illustrated by FIG. 7. The etch back process may further remove portions of gate structure 114 contacting source/drain region 116A. Thus, in the resulting structure, gate structure 114 may only be disposed on sidewalls of channel region 108, and gate structure 114 may not share any interfaces with source/drain regions 116A or 116B.

Figure 8:
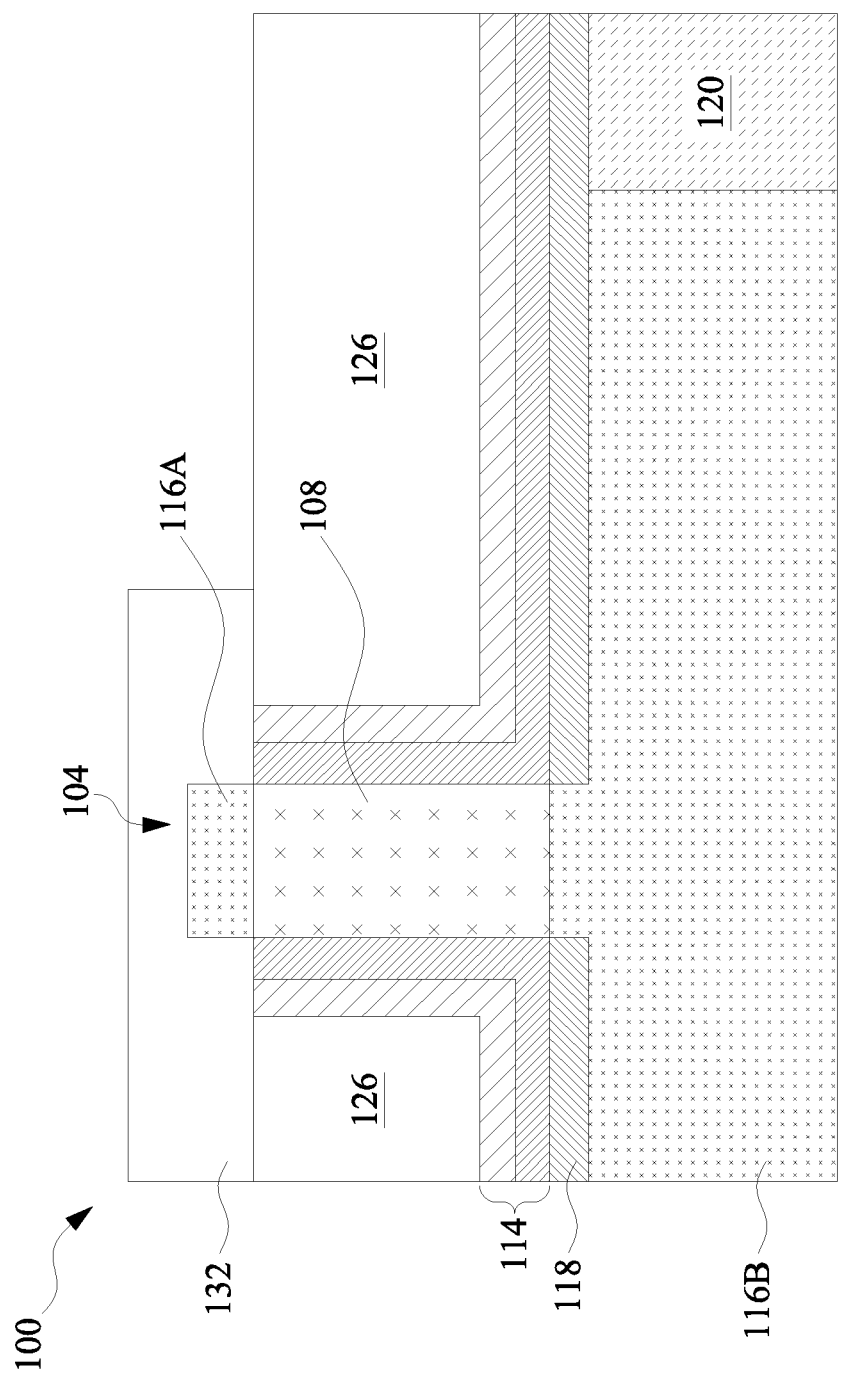

Referring next to FIG. 8, a spacer layer 132 is deposited over source/drain region 116A. In some embodiments, spacer layer 132 may comprise a similar material as spacer layer 118 (e.g., silicon nitride). Spacer layer 132 may be formed as a blanket layer and then patterned to expose portions of underlying ILD 126. The amount of ILD 126 exposed may depend on device design and may correspond to a desired dimension of gate structure 114 in the completed VGAA transistor 102 (see e.g., FIG. 1A).

Figure 9:
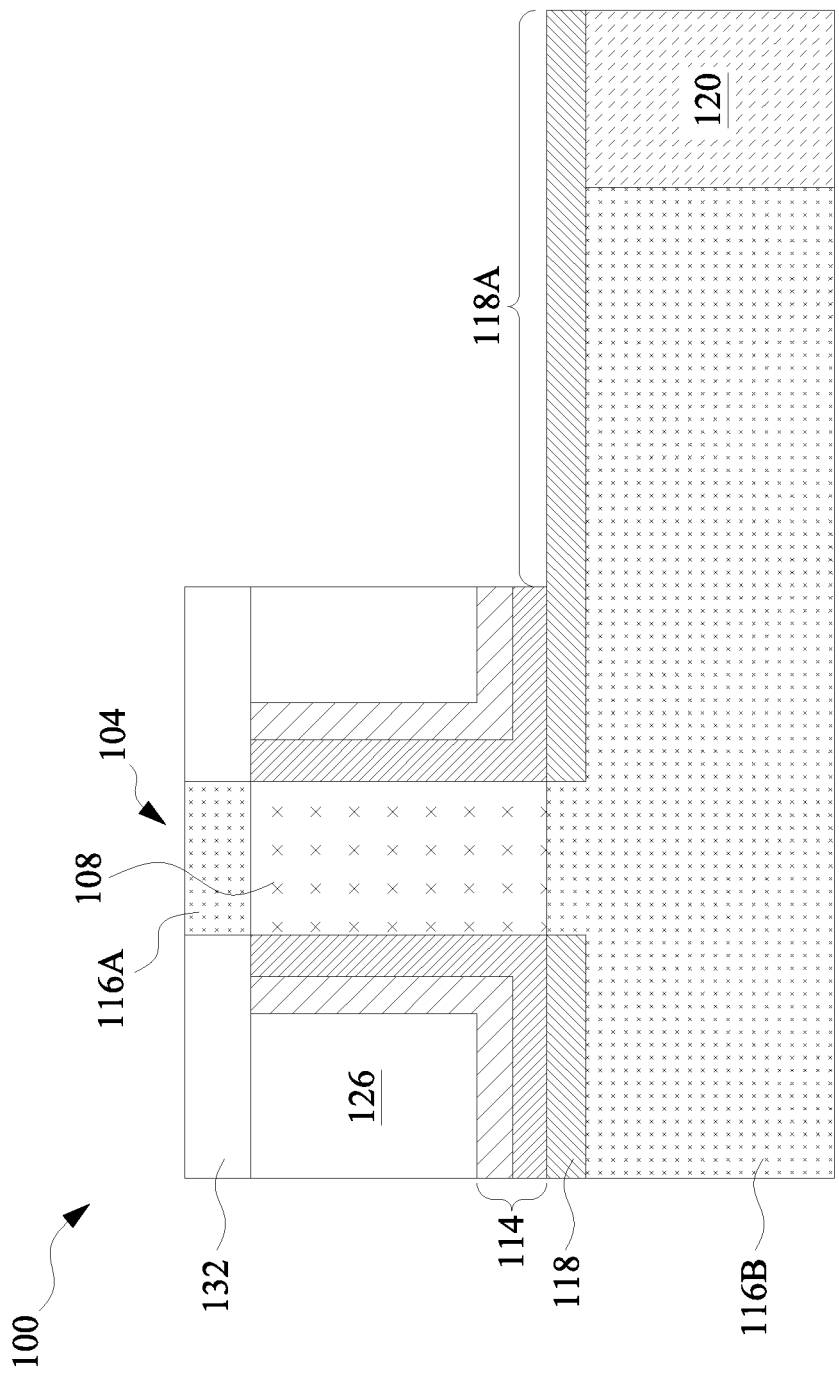

Furthermore, spacer layer 132 may cover a top surface of source/drain region 114A, and a planarization process (e.g., CMP) may be subsequently applied to expose source/drain region 116A as illustrated by FIG. 9. As further illustrated by FIG. 9, a patterning process (e.g., a combination of photolithography and etching) may be applied to remove portions of ILD 126 and gate structure 114 exposed by spacer layer 132. In some embodiments, spacer layer 118 may also be used as a contact etch stop layer during the patterning of gate structure 114 and spacer layer 132. The patterning process may further expose at least a portion 118A of spacer layer 118 over source/drain region 116B and STI region 120. The amount of ILD 126 and gate structure 114 removed may depend on a desired dimension for gate structure 114 in the completed VGAA transistor 102 (see e.g., FIG. 1A), which may vary depending on device design.

Figure 10:
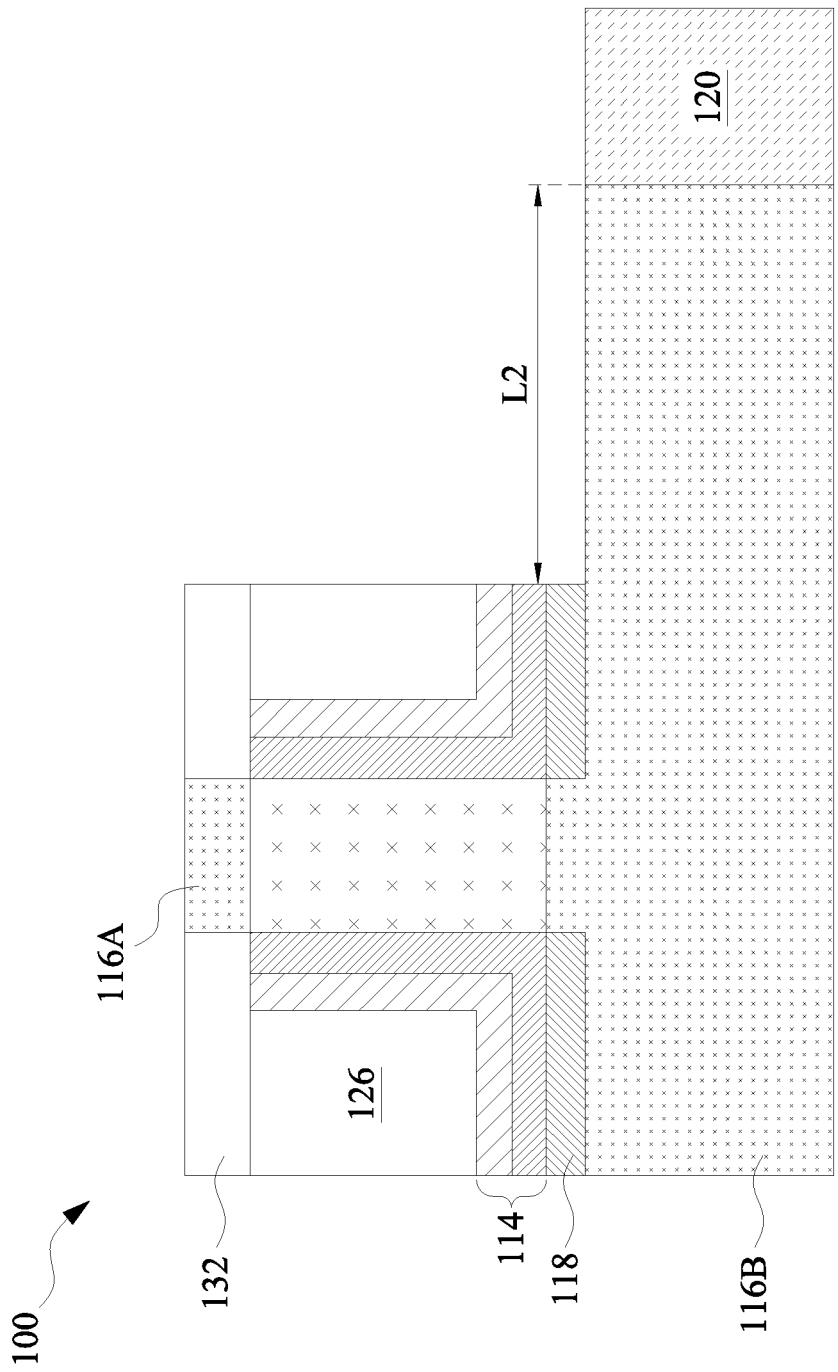

Subsequently, in FIG. 10, exposed portion 118A of spacer layer 118 is removed using, for example, a combination of photolithography and etching. Thus, a portion of source/drain region 116B is exposed for the formation of a silicide prior to the formation of any contacts to source/drain region 116B. A lateral dimension of the exposed source/drain region 116B may extend from an edge of gate structure 114 to STI region 120 and may correspond to the lateral dimension L2 of the subsequently formed silicide.

Figure 11:
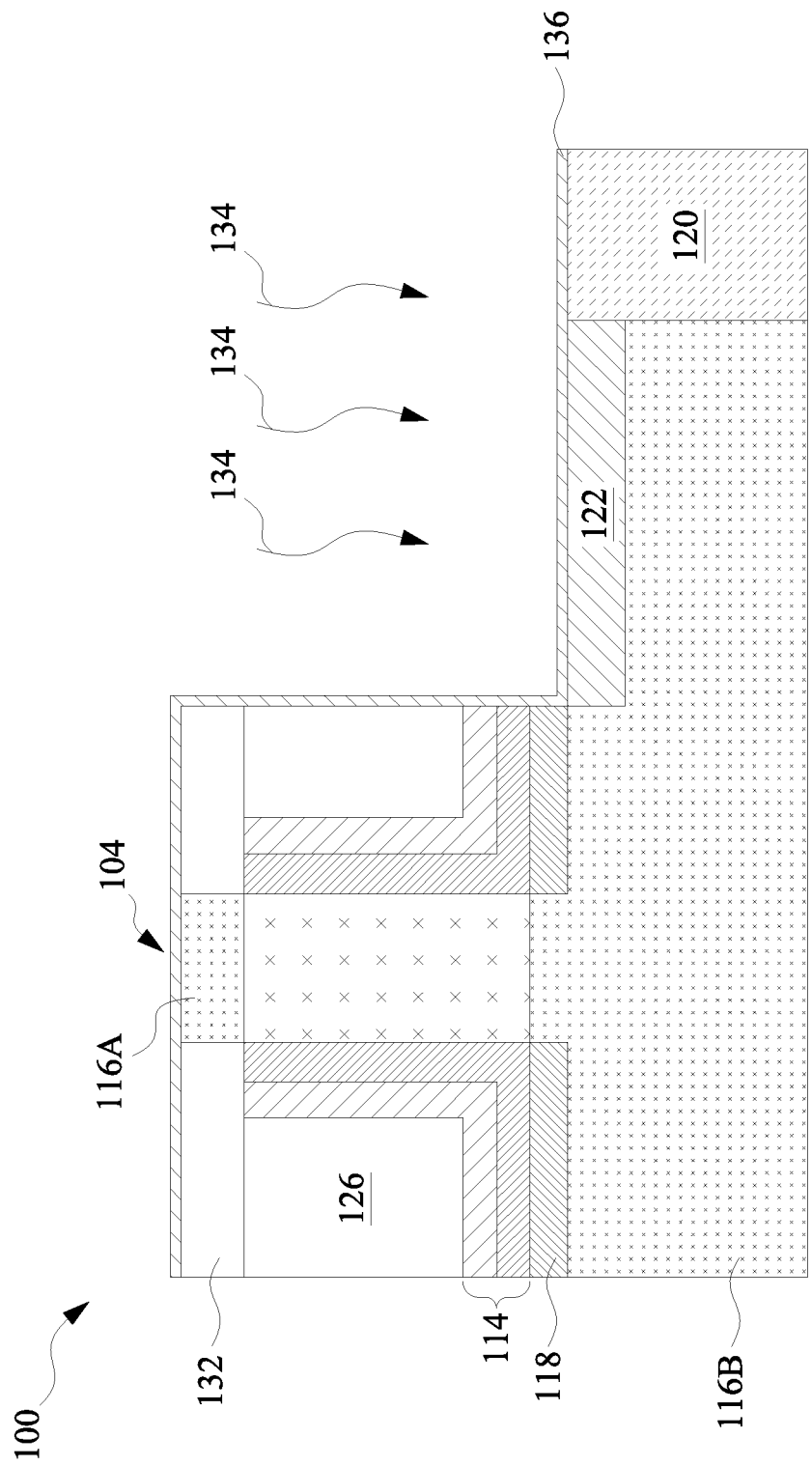
Figure 12:
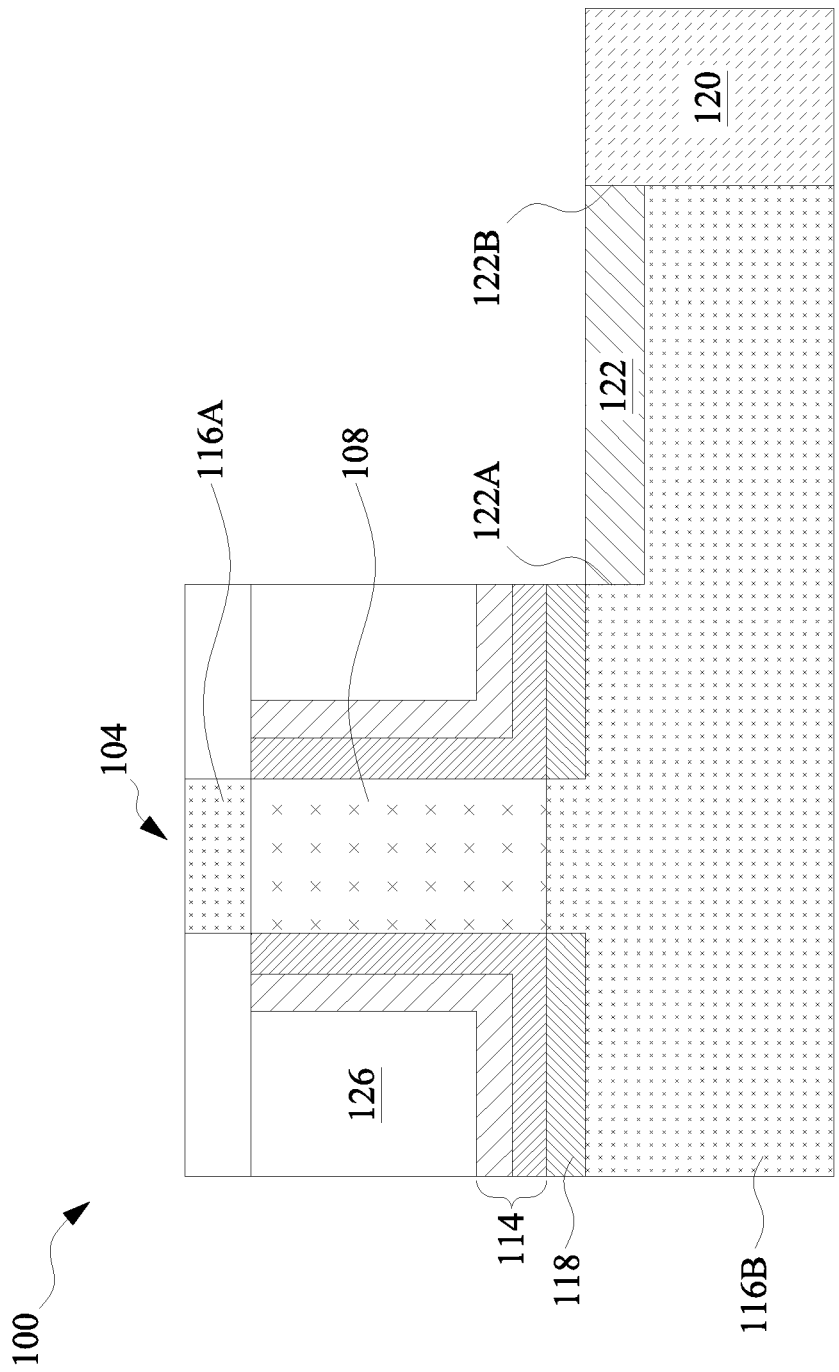

FIGS. 11 and 12 illustrate the formation of a silicide 122 in device 100. First, in FIG. 11, a conductive film 136 is deposited on exposed portions of source/drain region 116B. Conductive film 136 may further be a conformal layer deposited on STI region 120, spacer layer 132, and source/drain region 116A. In some embodiments, conductive film 136 comprises a metal, such as titanium, cobalt, nickel, and the like, for example.

After the deposition of conductive film 136, an annealing process may be performed to cause the diffusion of the material of conductive film 136 into underlying source/drain region 116B as indicated by arrows 134. For example, an annealing process may be performed at a temperature of about 100° C. to about 900° C. using argon (Ar) or nitrogen (N2) as a process gas under an atmospheric pressure of about 770 Torr to about 850 Torr. The annealing forms silicide 122 at an upper surface of source/region 116B as illustrated by FIG. 12. Silicide 122 may include a combination of the semiconductor material of source/drain region 116B and the conductive material of conductive film 136. For example, silicide 122 may include TiSi, NiSi, CoSi, combinations thereof, and the like. The annealing may further form a silicide (not illustrated) at an upper portion of source/drain region 116A.

Because STI region 120/spacer layer 132 comprises a dielectric material (e.g., an oxide or nitride), the annealing process may not cause diffusion of conductive material into STI region 120. Thus, the resulting silicide 122 may be self-aligned and formed only on portions of source/drain region 116B between gate structure 114 and STI region 120 as illustrated by FIG. 12. A silicide may also be formed in an upper portion of source/drain region 116A. For example, silicide 122 may include a first sidewall 122A aligned with a sidewall of gate structure 114, and silicide 122 may further include a second sidewall 122B aligned with a sidewall of STI region 120. After annealing, a cleaning process (e.g., a wet clean) may be applied to remove remaining, undiffused portions of conductive film 136 over silicide 122 and STI region 120, for example. The diffusion of the conductive material of conductive film 136 may increase the conductivity of affected areas of source/drain region 116B, thus forming a more suitable contact area for electrical connection.

Figure 13:
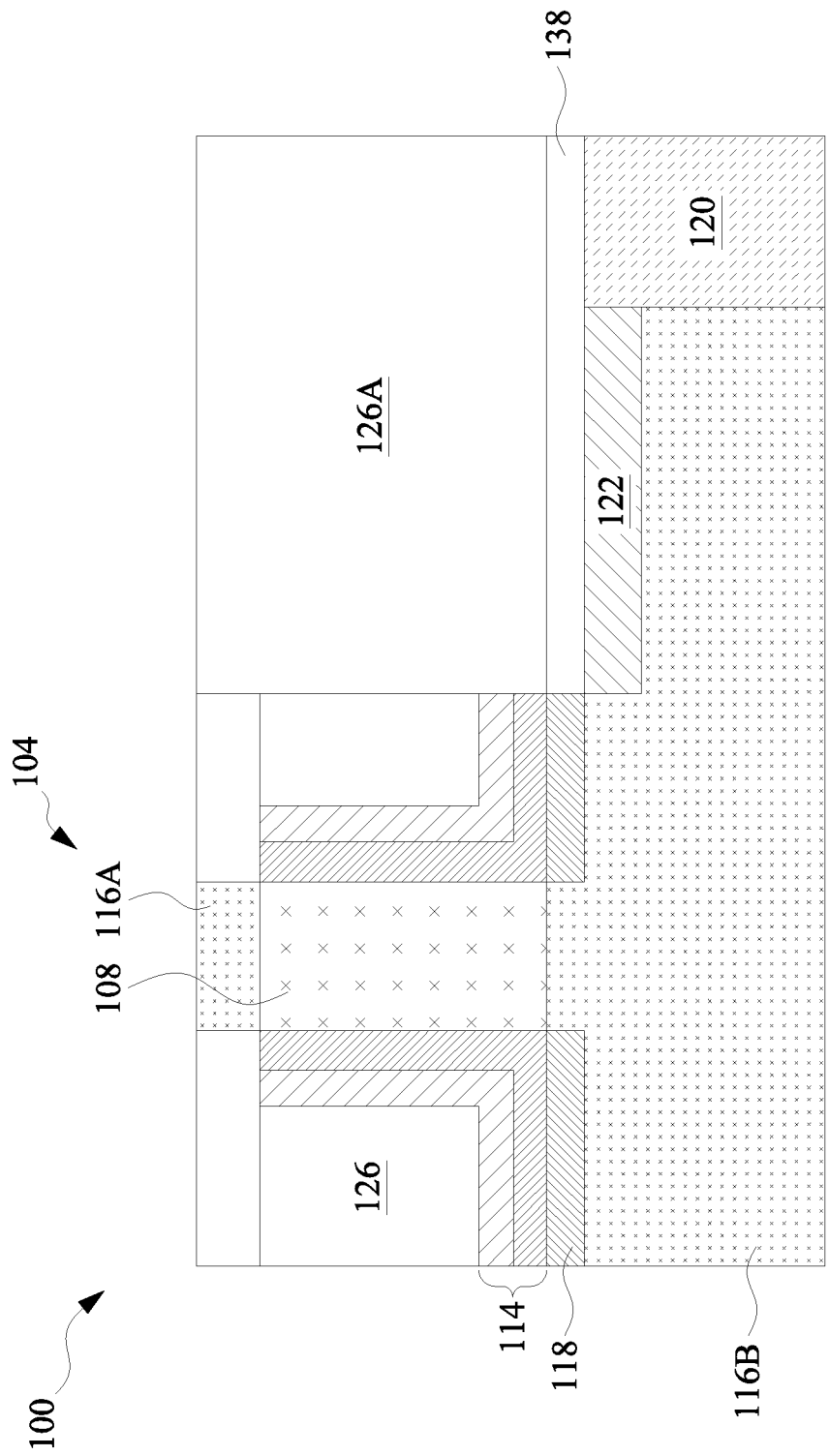
Figure 14:
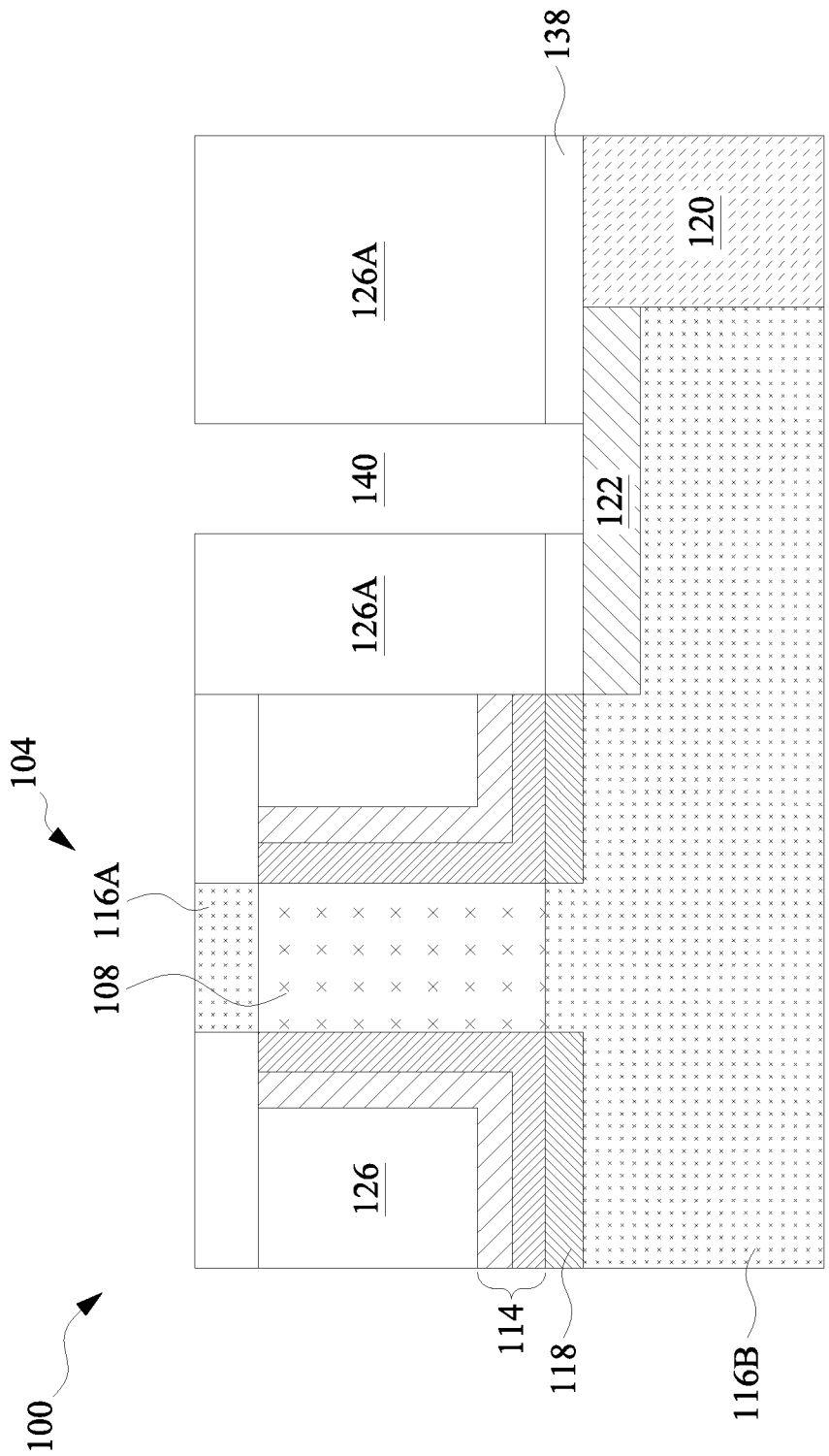

FIG. 13 illustrates the formation of a contact etch stop layer (CESL) 138 and additional ILD material 126A may be formed over silicide 122 and STI region 120. CESL 138 may comprise silicon nitride (SiN), for example, and ILD 126A may comprise a low-k dielectric material, which may be a substantially similar material as ILD 126. CESL 138 may further act as a buffer layer for underlying silicide 122. Subsequently, as illustrated by FIG. 14, an opening 140 may be formed extending through ILD 126A and CESL 138 using, for example, a combination of photolithography and etching. Opening 140 may partially expose underlying silicide 122.

Figure 15:
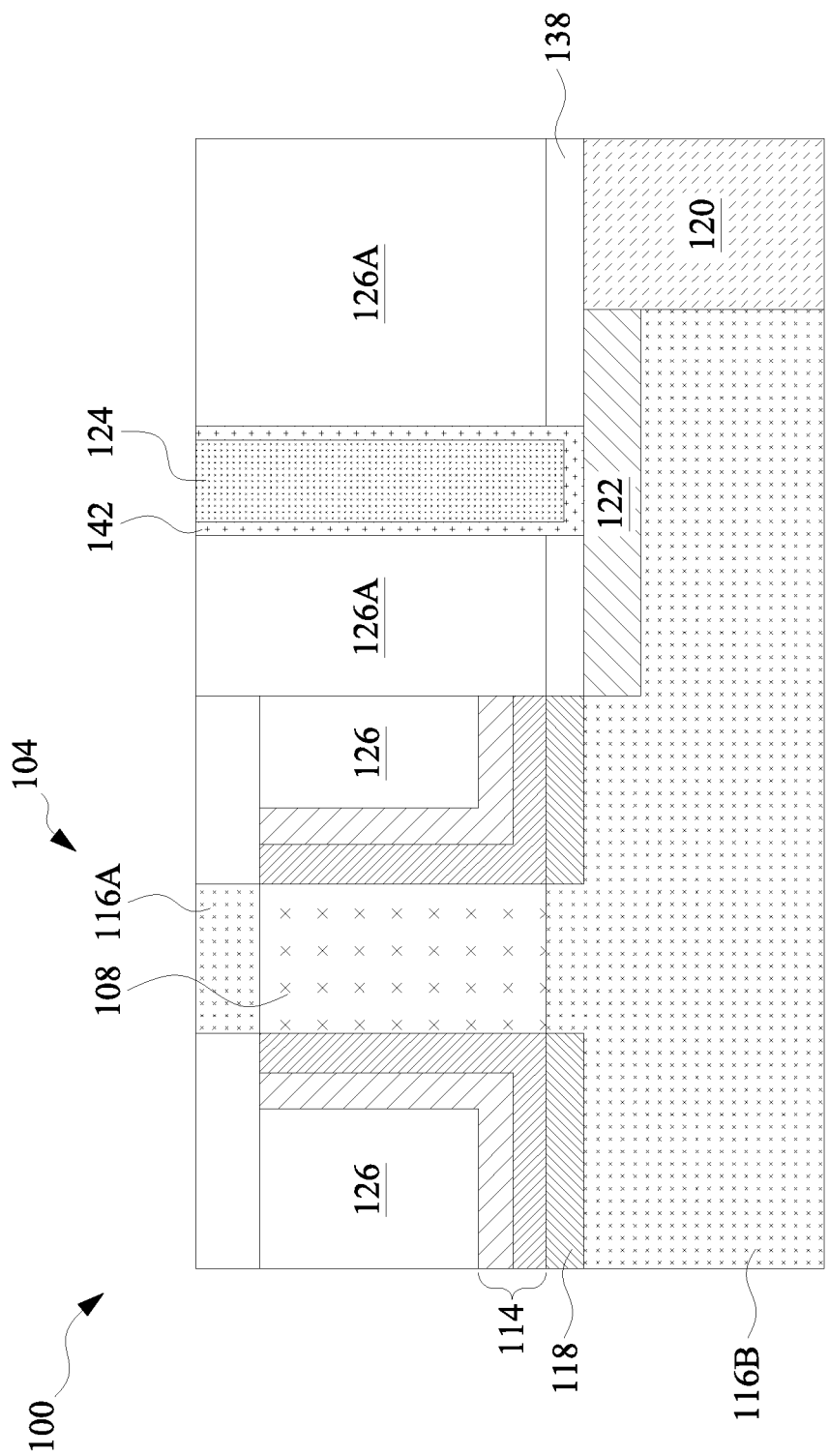

Next, as illustrated by FIG. 15, opening 140 may be filled with a conductive material such as, tungsten, aluminum, copper, gold, silver, alloys thereof, combinations thereof, and the like to form contact 124 electrically connected to silicide 122. The formation of contact 124 may also include first depositing a diffusion barrier layer and 142 on a bottom surface and sidewalls of opening 140. For example, barrier layer 140 may comprise titanium nitride, titanium oxide, tantalum nitride, tantalum oxide, and the like, and barrier layer 140 may be formed to reduce diffusion of the conductive material of contact 124 into the surrounding dielectric material of ILD 126A. The formation of barrier layer/seed layer 142 and contact 124 may overflow opening 140, and a planarization process (e.g., CMP) may be performed to remove excess conductive material from device 100. In some embodiments, a seed layer (not illustrated) may also be formed prior to the formation of contact 124, and forming contact 124 may include an electroless plating process using the seed layer.

Thus, as described above, a silicide 122 is formed before an overlaying ILD and contact 124. In the resulting structure, silicide 122 may be spaced closer to nanowire 144 and have a larger lateral surface area than contact 124. Thus, parasitic resistance and contact resistance may be advantageously reduced. Furthermore, silicide 122 may be formed after gate structure 114, which may advantageously prevent damage to silicide 122 during the formation of gate structure 114.

Figure 16:
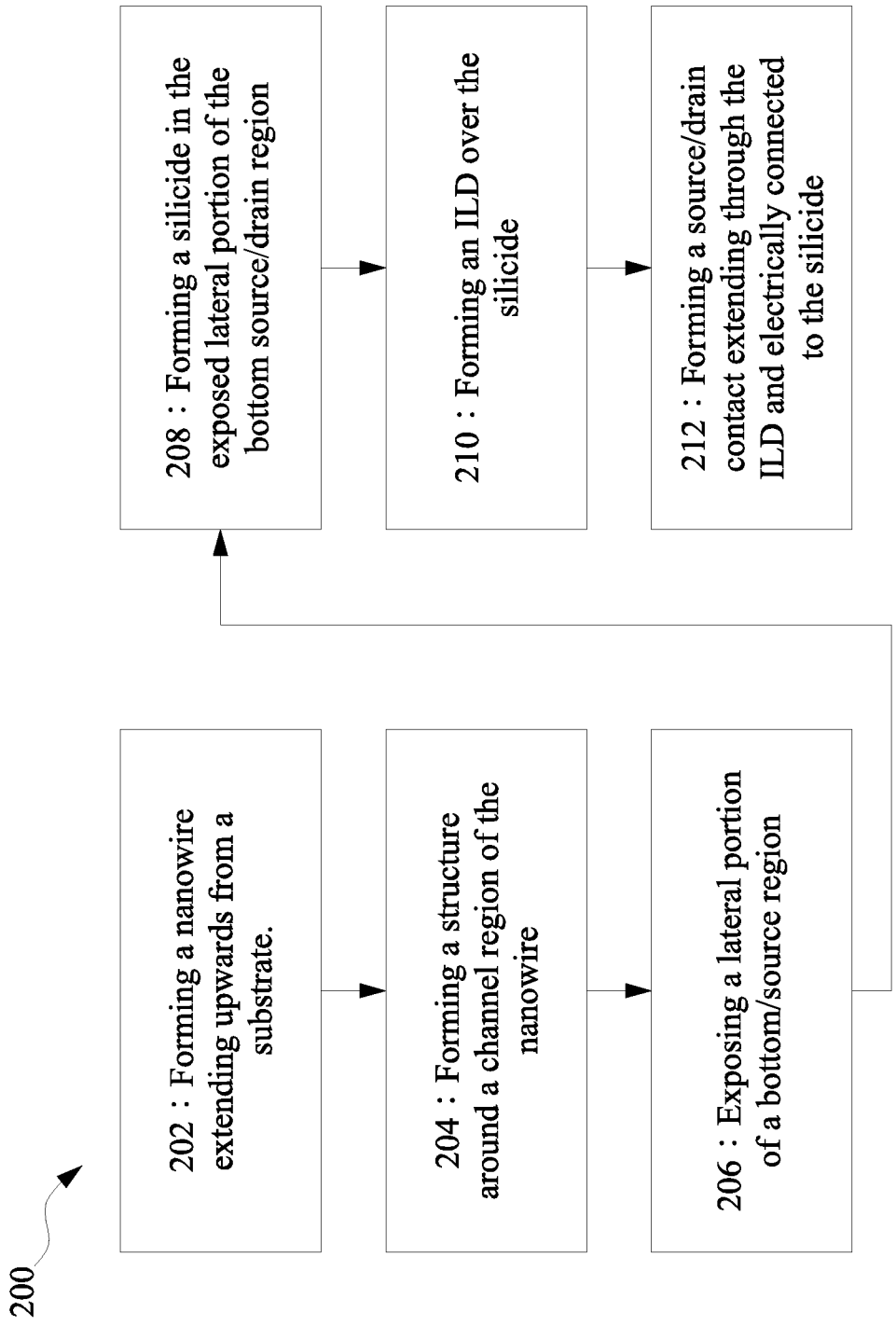
FIG. 16 illustrates a process flow for forming a semiconductor device having a VGAA transistor in accordance with some embodiments.

FIG. 16 illustrates a flow diagram of an example process flow 200 in accordance with some embodiments. In step 202, a nanowire (e.g., nanowire 104) is formed extending upwards from a substrate (e.g., substrate 106). The nanowire may include a bottom source/drain region (e.g., source/drain region 116B), a channel region (e.g., channel region 108) over the bottom source/drain region, and a top source/drain region (e.g., source/drain region 116A) over the channel region. The bottom source/drain region may further extend into an upper portion of the substrate and extend laterally past the nanowire. In step 204, a gate structure (e.g., gate structure 114) is formed around the channel region of the nanowire.

In step 206, a lateral portion of the bottom source/drain region is exposed, for example, by patterning the gate structure. In step 208, a silicide (e.g., silicide 122) may be formed in an upper surface of the exposed portion of the bottom source/drain region. The silicide may extend from an edge of the gate structure to an STI region. For example, sidewalls of the silicide may be aligned with a sidewall of the gate structure and a sidewall of the STI region. In step 210, an ILD (e.g., ILD 126A) is formed over the silicide. In step 212, a source/drain contact (e.g., contact 124) is formed extending through the ILD and electrically connected to the silicide.

Thus, a semiconductor device having a VGAA transistor may be formed. A bottom source/drain region of the VGAA transistor may extend into an upper portion of a semiconductor substrate and extend laterally past edges of a nanowire. A self-aligned silicide region may be formed in an upper portion of the bottom source/drain region after a gate structure of the VGAA structure. Furthermore, in various embodiments the silicide region is formed before a corresponding interlayer dielectric (ILD) and/or contact to the bottom source/drain region are formed over the bottom source/drain region. Thus, the silicide region can be formed to have a greater surface area than a subsequently formed contact, advantageously improving yield and reducing contact resistance. Furthermore, the resulting silicide region may be spaced closer to the nanowire (e.g., the channel region) of the VGAA transistor, which also advantageously reduces parasitic resistance.

In accordance with an embodiment, a semiconductor device includes a nanowire extending upwards from a semiconductor substrate, a source/drain region in the nanowire, and a channel region in the nanowire over the source/drain region. The source/drain region further extends into the semiconductor substrate past edges of the nanowire. The semiconductor device further includes a gate structure encircling the channel region and a silicide in an upper portion of the source/drain region. A sidewall of the silicide is aligned with a sidewall of the gate structure.

In accordance with another embodiment, a method of forming a semiconductor device includes forming a vertical gate all around (VGAA transistor). The VGAA transistor includes a first source/drain region, a channel region in the nanowire over the first source/drain region, a second source/drain region in the nanowire over the channel region, and a gate structure encircling the channel region. The first source/drain region includes a first portion in a nanowire and a second portion disposed at an upper surface of a semiconductor substrate and laterally past the nanowire. After forming the gate structure, the method includes forming a silicide in the second portion of the first source/drain region, and after forming the silicide, forming an interlayer dielectric (ILD) over the silicide. A source/drain contact is formed extending through the ILD and electrically connected to the silicide.

In accordance with yet another embodiment, a method for forming a semiconductor device includes forming a source/drain region. The source/drain region includes a vertical portion in a nanowire and a lateral portion extending laterally past the nanowire at an upper surface of a substrate. A channel region is formed in the nanowire on the source/drain region, and a gate structure is formed over the source/drain region and around the channel region. The method further includes partially exposing the lateral portion of the source/drain region, wherein partially exposing the lateral portion of the source/drain region comprises patterning the gate structure. A conductive film is formed on the lateral portion of the source/drain region, and an anneal is performed on the conductive film to form a silicide in the source/drain region. After performing the anneal, an interlayer dielectric (ILD) is formed over the silicide, and a source/drain contact extending through the ILD and electrically connected to the silicide is also formed.

In accordance with an embodiment, a semiconductor device includes a vertical gate all around (VGAA) transistor. The VGAA transistor includes a first source/drain region at a top surface of a semiconductor substrate, a channel region over the first source/drain region, a second source/drain region over the channel region, and a gate structure disposed around the channel region. The semiconductor device further includes a shallow trench isolation (STI) region adjacent the first source/drain region and a silicide region in the first source/drain region. The silicide region extends laterally from the gate structure to the STI region.

In accordance with an embodiment, a device includes a semiconductor substrate, a source/drain region at a top surface of the semiconductor substrate (a portion of the source/drain region extends into a nanowire), a silicide region at a top surface of the source/drain region, and a gate structure disposed around a channel region of the nanowire disposed over the portion of the source/drain region. The device further includes a dielectric layer disposed along sidewalls of the gate structure and a source/drain contact extending through the dielectric layer and electrically connected to the source/drain region through the silicide region. A lateral distance between the silicide region and the channel region is less than a lateral distance between the source/drain contact and the channel region The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
 a nanowire extending upwards from a semiconductor substrate;
 a first source/drain region in the nanowire, wherein the first source/drain region further extends into the semiconductor substrate past edges of the nanowire; and
 a channel region in the nanowire over the first source/drain region;
 a gate structure encircling the channel region; and
 a silicide in an upper portion of the first source/drain region, wherein the silicide extends to a sidewall of the gate structure.

2. The semiconductor device of claim 1 further comprising a shallow trench isolation (STI) region in the semiconductor substrate, wherein the silicide extends to the STI region.

3. The semiconductor device of claim 1 further comprising:
   an interlayer dielectric layer (ILD) over the silicide; and
   a contact extending through the ILD and electrically connected to the silicide.

4. The semiconductor device of claim 3, wherein a first lateral dimension of the silicide is greater than a second lateral dimension of the contact.

5. The semiconductor device of claim 3, wherein a sidewall of the silicide is closer to the nanowire than the contact.

6. The semiconductor device of claim 1 further comprising a spacer layer disposed between the first source/drain region and the gate structure.

7. The semiconductor device of claim 1, further comprising a second source/drain region in the nanowire over the channel region.

8. The semiconductor device of claim 1, wherein the silicide does not extend into at least a portion of the first source/drain region under the gate structure.

9. A semiconductor device comprising:
   a vertical gate all around (VGAA) transistor, the transistor comprising:
      a first source/drain region at a top surface of a semiconductor substrate;
      a channel region over the first source/drain region;
      a second source/drain region over the channel region; and
      a gate structure disposed around the channel region;
   a shallow trench isolation (STI) region adjacent the first source/drain region; and
   a silicide region in the first source/drain region, wherein the silicide region extends laterally from the gate structure to the STI region.

10. The semiconductor device of claim 9 further comprising a dielectric layer over the top surface of the semiconductor substrate, wherein the dielectric layer extends along sidewalls of the gate structure and the second source/drain region.

11. The semiconductor device of claim 10 further comprising a source/drain contact extending through the dielectric layer and electrically connected to first source/drain region through the silicide region.

12. The semiconductor device of claim ii, wherein a lateral dimension of the silicide region is greater than a lateral dimension of the first source/drain region.

13. The semiconductor device of claim 9, wherein the channel region, the second source/drain region, and at least a portion of the first source/drain region are disposed in a nanowire extending upwards from the semiconductor substrate.

14. The semiconductor device of claim 9, wherein the silicide region is disposed along multiple sides of the gate structure in a top-down view of the semiconductor device.

15. The semiconductor device of claim 9, wherein the STI region is disposed along multiple sides of the gate structure in a top-down view of the semiconductor device.

16. A device comprising:
   a semiconductor substrate;
   a source/drain region at a top surface of the semiconductor substrate, wherein a portion of the source/drain region extends into a nanowire;
   a silicide region at a top surface of the source/drain region;
   a gate structure disposed around a channel region of the nanowire, wherein the gate structure is further disposed over the portion of the source/drain region;
   a dielectric layer disposed along sidewalls of the gate structure; and
   a source/drain contact extending through the dielectric layer and electrically connected to the source/drain region through the silicide region, wherein a lateral distance between the silicide region and the channel region is less than a lateral distance between the source/drain contact and the channel region.

17. The device of claim 16 further comprising a shallow trench isolation (STI) region extending into the semiconductor substrate, wherein the silicide region extends to a sidewall of the STI region.

18. The device of claim 16, wherein the silicide region extends to a line disposed along a sidewall of the gate structure.

19. The device of claim 16, wherein the gate structure is disposed around a channel region of a plurality of nanowires.

20. The device of claim 16, wherein the nanowire further includes an additional source/drain region over the channel region, wherein a top of the gate structure is substantially level with a bottom of the additional source/drain region.

* * * * *

UNITED STATES PATENT AND TRADEMARK OFFICE
CERTIFICATE OF CORRECTION

PATENT NO. : 9,716,143 B2
APPLICATION NO. : 15/194238
DATED : July 25, 2017
INVENTOR(S) : Kai-Chieh Yang et al.

Page 1 of 1

It is certified that error appears in the above-identified patent and that said Letters Patent is hereby corrected as shown below:

In the Claims

In Column 12, Line 1, Claim 12, delete "claim ii" and insert --claim 11--.

Signed and Sealed this
Nineteenth Day of December, 2017

Joseph Matal
*Performing the Functions and Duties of the*
*Under Secretary of Commerce for Intellectual Property and*
*Director of the United States Patent and Trademark Office*